(12) United States Patent
Fiedler et al.

(10) Patent No.: US 11,479,854 B2
(45) Date of Patent: Oct. 25, 2022

(54) APPARATUS AND METHOD OF DEPOSITING A LAYER AT ATMOSPHERIC PRESSURE

(71) Applicant: Infineon Technologies AG, Neubiberg (DE)

(72) Inventors: Olaf Fiedler, Dresden (DE); Ullrich Hannemann, Dresden (DE); Andre Horn, Dresden (DE); Daniel Kai Simon, Dresden (DE); Sigurd Volker Zehner, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 403 days.

(21) Appl. No.: 16/545,872

(22) Filed: Aug. 20, 2019

(65) Prior Publication Data

US 2020/0063257 A1  Feb. 27, 2020

(30) Foreign Application Priority Data

Aug. 23, 2018 (DE) .......................... 102018120580.5

(51) Int. Cl.
*C23C 16/455* (2006.01)
*C23C 16/52* (2006.01)
*C23C 16/453* (2006.01)
*H01L 21/02* (2006.01)
*H01L 21/285* (2006.01)

(52) U.S. Cl.
CPC ...... *C23C 16/45502* (2013.01); *C23C 16/453* (2013.01); *C23C 16/52* (2013.01); *H01L 21/02271* (2013.01); *H01L 21/28556* (2013.01)

(58) Field of Classification Search
CPC ............ C23C 16/45502; C23C 16/453; H01L 21/02271; H01L 21/28556; H01L 21/76862
See application file for complete search history.

(56) References Cited

U.S. PATENT DOCUMENTS

| | | | | |
|---|---|---|---|---|
| 4,788,082 A | * | 11/1988 | Schmitt | H01M 4/0471 427/255.6 |
| 4,834,020 A | * | 5/1989 | Bartholomew | C23C 16/45519 118/725 |
| 4,956,204 A | * | 9/1990 | Amazawa | H01L 29/4925 427/255.393 |
| 5,113,789 A | * | 5/1992 | Kamian | C23C 16/545 118/733 |
| 5,136,975 A | * | 8/1992 | Bartholomew | C23C 16/54 118/725 |

(Continued)

FOREIGN PATENT DOCUMENTS

DE   10345824 A1   5/2005
DE   102014106339 A1   11/2014

*Primary Examiner* — Jeffrie R Lund
(74) *Attorney, Agent, or Firm* — Murphy, Bilak & Homiller, PLLC

(57) ABSTRACT

A method of depositing a layer includes measuring a physical property that is related to an air pressure in a reactor chamber of a deposition apparatus. A main gas mixture including a source gas and an auxiliary gas is introduced into the reactor chamber at atmospheric pressure, the source gas including a precursor material and a carrier gas. A gas flow of at least one of the source gas and the auxiliary gas into the reactor chamber is controlled in response to a change of the air pressure in the reactor chamber.

9 Claims, 7 Drawing Sheets

(56) References Cited

U.S. PATENT DOCUMENTS

| | | | | |
|---|---|---|---|---|
| 5,304,398 A * | 4/1994 | Krusell | C23C 16/402 | 427/314 |
| 5,551,982 A * | 9/1996 | Anderson | C30B 25/14 | 118/725 |
| 5,683,516 A * | 11/1997 | DeDontney | C23C 16/4405 | 118/718 |
| 5,849,088 A * | 12/1998 | DeDontney | C23C 16/4401 | 118/725 |
| 5,851,293 A * | 12/1998 | Lane | B01D 53/74 | 95/22 |
| 5,968,593 A * | 10/1999 | Sakamoto | H01L 21/67109 | 438/758 |
| 6,028,014 A * | 2/2000 | Sukjarev | C23C 16/402 | 438/789 |
| 6,143,080 A * | 11/2000 | Bartholomew | C23C 16/52 | 118/718 |
| 6,155,540 A * | 12/2000 | Takamatsu | C23C 16/4481 | 261/78.2 |
| 7,422,635 B2 * | 9/2008 | Zheng | C23C 16/45546 | 118/724 |
| 9,748,125 B2 * | 8/2017 | Wu | C23C 16/4584 | |
| 10,179,941 B1 * | 1/2019 | Khan | C30B 25/14 | 118/728 |
| 10,236,198 B2 * | 3/2019 | Wu | H01J 37/32816 | 156/345.29 |
| 2001/0006705 A1 * | 7/2001 | Takeshima | C23C 16/45561 | 427/255.28 |
| 2001/0048981 A1 * | 12/2001 | Suzuki | C23C 16/54 | 427/535 |
| 2002/0088389 A1 * | 7/2002 | Kommu | C23C 16/455 | 118/728 |
| 2002/0111040 A1 * | 8/2002 | Yamazaki | H01L 21/31612 | 257/E21.279 |
| 2002/0132374 A1 * | 9/2002 | Basceri | C23C 16/409 | 257/E21.272 |
| 2002/0173130 A1 * | 11/2002 | Pomerede | H01L 21/0262 | 438/286 |
| 2002/0187256 A1 * | 12/2002 | Elers | C23C 16/0272 | 257/E21.585 |
| 2003/0036272 A1 * | 2/2003 | Shamouilian | C23C 16/4405 | 438/691 |
| 2003/0094136 A1 * | 5/2003 | Bartholomew | C23C 16/453 | 118/715 |
| 2003/0143747 A1 * | 7/2003 | Bondestam | C30B 25/14 | 436/55 |
| 2003/0164225 A1 * | 9/2003 | Sawayama | H01J 37/32834 | 118/715 |
| 2003/0228413 A1 * | 12/2003 | Ohta | G02B 1/11 | 427/569 |
| 2004/0096582 A1 * | 5/2004 | Wang | H01L 21/02222 | 556/412 |
| 2004/0129969 A1 * | 7/2004 | Colombo | H01L 21/28194 | 257/E21.01 |
| 2004/0166597 A1 | 8/2004 | Strang | | |
| 2004/0250755 A1 * | 12/2004 | Ivanov | H01L 21/288 | 257/E21.174 |
| 2005/0039686 A1 * | 2/2005 | Zheng | C23C 16/45546 | 118/728 |
| 2005/0045102 A1 * | 3/2005 | Zheng | C23C 16/45578 | 118/722 |
| 2005/0095859 A1 * | 5/2005 | Chen | C23C 16/52 | 438/689 |
| 2006/0205187 A1 * | 9/2006 | Zheng | C23C 16/4583 | 438/478 |
| 2006/0213440 A1 * | 9/2006 | Zheng | C23C 16/4583 | 118/715 |
| 2007/0137794 A1 * | 6/2007 | Qiu | H01L 21/67109 | 118/725 |
| 2007/0154638 A1 * | 7/2007 | You | C23C 16/4412 | 427/248.1 |
| 2009/0163042 A1 * | 6/2009 | Tseng | H01L 21/67017 | 257/E21.333 |
| 2009/0191717 A1 * | 7/2009 | Kim | C23C 16/45551 | 438/758 |
| 2009/0263578 A1 * | 10/2009 | Lindfors | C23C 16/4485 | 427/248.1 |
| 2010/0126406 A1 * | 5/2010 | Yan | C30B 25/14 | 117/103 |
| 2011/0174212 A1 * | 7/2011 | Ramachandran | C30B 25/14 | 118/728 |
| 2011/0247556 A1 * | 10/2011 | Raring | C23C 16/45587 | 118/713 |
| 2011/0277681 A1 * | 11/2011 | Arena | C23C 16/34 | 118/724 |
| 2012/0100722 A1 * | 4/2012 | Asai | C23C 16/54 | 438/758 |
| 2012/0111427 A1 * | 5/2012 | Nozawa | H01J 37/32449 | 137/511 |
| 2012/0190208 A1 * | 7/2012 | Ozu | C23C 16/455 | 156/345.33 |
| 2012/0225296 A1 * | 9/2012 | Zhong | C01B 32/186 | 977/734 |
| 2012/0234230 A1 * | 9/2012 | Halpin | C30B 29/06 | 117/97 |
| 2013/0052346 A1 | 2/2013 | Higashi et al. | | |
| 2013/0092084 A1 | 4/2013 | Shao et al. | | |
| 2013/0115781 A1 * | 5/2013 | Matsumoto | H01L 21/32136 | 438/726 |
| 2013/0118895 A1 * | 5/2013 | Roozeboom | H01L 21/67028 | 204/192.34 |
| 2013/0192524 A1 * | 8/2013 | Wu | H01L 21/67346 | 414/806 |
| 2013/0280919 A1 * | 10/2013 | Yuasa | H01L 21/02183 | 438/778 |
| 2013/0323421 A1 * | 12/2013 | Honma | C23C 14/08 | 118/725 |
| 2014/0137801 A1 * | 5/2014 | Lau | C30B 25/14 | 118/728 |
| 2014/0170858 A1 * | 6/2014 | Harada | H01L 21/02214 | 438/758 |
| 2014/0216585 A1 * | 8/2014 | Tjandra | H01L 21/67017 | 137/896 |
| 2014/0261178 A1 * | 9/2014 | Du Bois | H01J 37/32715 | 118/723 E |
| 2015/0010718 A1 * | 1/2015 | Jost | C23C 16/44 | 427/248.1 |
| 2015/0086729 A1 * | 3/2015 | Gortzen | C23C 16/45546 | 427/586 |
| 2015/0303054 A1 * | 10/2015 | Hanashima | H01L 21/28562 | 438/758 |
| 2016/0027618 A1 * | 1/2016 | Kawakami | H01J 37/32816 | 156/345.29 |
| 2016/0122874 A1 * | 5/2016 | Vermeer | C23C 16/4584 | |
| 2016/0362784 A1 * | 12/2016 | Isobe | C23C 16/45502 | |
| 2016/0376156 A1 * | 12/2016 | Choubak | H01L 21/28562 | 438/758 |
| 2017/0145564 A1 * | 5/2017 | Bertuch | C30B 25/14 | 118/728 |
| 2017/0148579 A1 * | 5/2017 | Snaith | H01L 21/02214 | 438/758 |
| 2017/0314126 A1 * | 11/2017 | Tjandra | C23C 16/45502 | |
| 2017/0365491 A1 * | 12/2017 | Wu | C23C 16/45587 | 118/713 |
| 2018/0105930 A1 * | 4/2018 | Kang | C23C 16/45551 | 438/758 |
| 2018/0135171 A1 * | 5/2018 | L'Heureux | H01L 21/67109 | 118/725 |
| 2018/0163301 A1 * | 6/2018 | Komeno | H01L 21/67017 | 137/896 |
| 2019/0017131 A1 * | 1/2019 | Khan | C23C 16/34 | 118/724 |
| 2019/0148178 A1 * | 5/2019 | Liang | H01L 21/32136 | 438/726 |
| 2020/0063257 A1 * | 2/2020 | Fiedler | C23C 16/455 | 156/345.33 |

\* cited by examiner

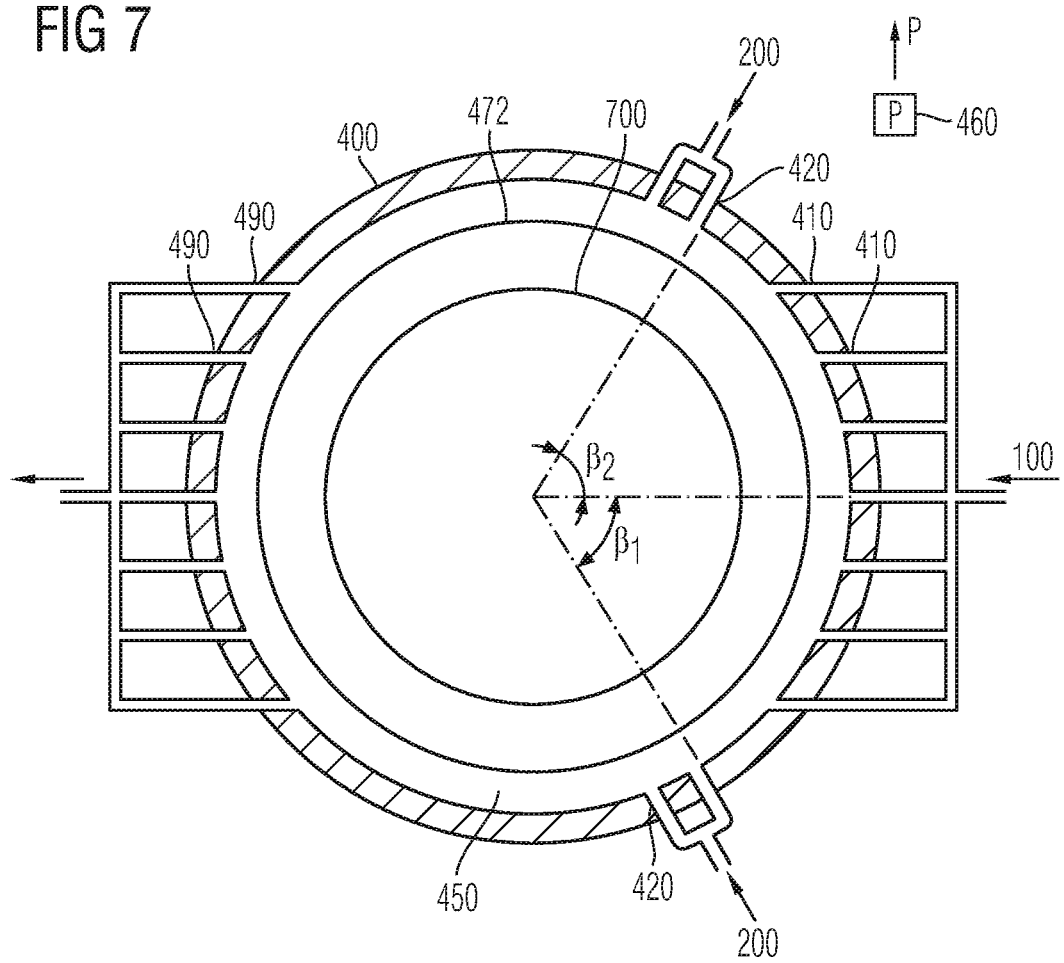

APPARATUS AND METHOD OF DEPOSITING A LAYER AT ATMOSPHERIC PRESSURE

TECHNICAL FIELD

The present disclosure relates to an apparatus for forming a layer and to a method of forming a layer at atmospheric pressure.

BACKGROUND

CVD (chemical vapor deposition) deposits dielectric layers, metallic layers, amorphous semiconductor layers, polycrystalline semiconductor layers or single-crystalline semiconductor layers on a front surface of a substrate. For example, vapor phase epitaxy may grow single-crystal layers on an appropriate crystalline basis. A semiconductor wafer may be placed on a wafer holder (susceptor) in a deposition chamber of a deposition apparatus. The front surface of the semiconductor wafer may be subjected to a cleaning gas and then to a vaporous silicon source such as a silane at an appropriate temperature and at an appropriate pressure to deposit and/or grow a crystalline silicon layer on the substrate front surface. During deposition of the semiconductor layer the susceptor may rotate to improve uniformity of the deposition across the front surface of the semiconductor wafer. There is a need to further improve the deposition of layers, e.g., semiconductor layers.

SUMMARY

An embodiment of the present disclosure relates to a method of depositing a semiconductor layer. A physical property is measured that is related to an air pressure in a reactor chamber of a deposition apparatus. A main gas mixture is introduced into the reactor chamber at an atmospheric pressure, wherein the main gas mixture includes a source gas and an auxiliary gas. The source gas includes a precursor material and a carrier gas. A gas flow of at least one of the source gas and the auxiliary gas into the reactor chamber is controlled in response to a change of the air pressure in the reactor chamber.

Another embodiment of the present disclosure relates to an apparatus for forming a semiconductor layer. The apparatus includes a deposition apparatus, a first main flow controller unit, a second main flow controller unit and a processor unit. The deposition apparatus is adapted for the deposition of a semiconductor layer at atmospheric pressure. The first main flow controller unit is configured to control a gas flow of a source gas into a reactor chamber of the deposition apparatus, wherein the source gas contains a precursor material and a carrier gas. The second main flow controller unit is configured to control a gas flow of an auxiliary gas into the reactor chamber. The processor unit is configured to control at least one of the first and second main flow controller units in response to information about a change of an air pressure in the reactor chamber.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate the embodiments of the present disclosure and together with the description serve to explain principles of the embodiments. Other embodiments and intended advantages will be readily appreciated as they become better understood by reference to the following detailed description.

FIG. 7 is a schematic horizontal cross-sectional view of a vapor phase deposition apparatus with groups of cross-flow inlets according to a further embodiment.

DETAILED DESCRIPTION

In the following detailed description, reference is made to the accompanying drawings, which form a part hereof and in which are shown by way of illustrations specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The term "gas flow" as used in the following stands for a mass flow of a gaseous substance. "Flow speed" is a scalar and corresponds to the length of the flow velocity vector of the mass flow.

Figure 1:
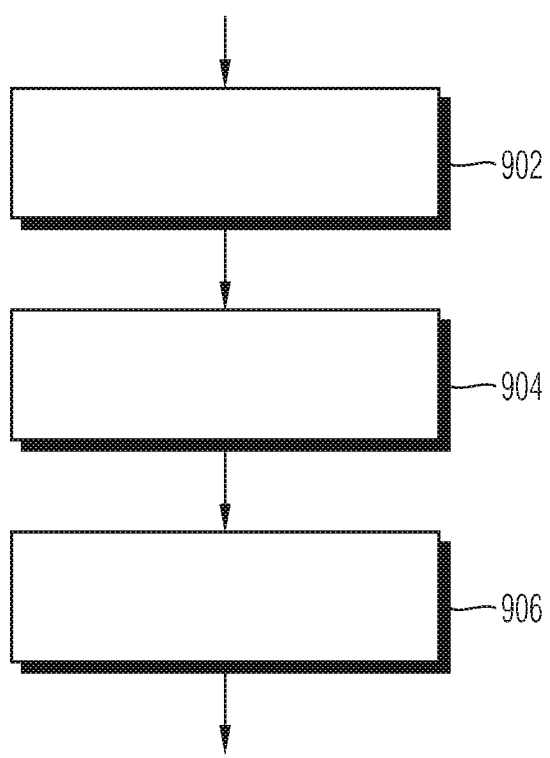
FIG. 1 is a schematic flowchart of a layer deposition method according to an embodiment.

FIG. 1 refers to an embodiment of a method of depositing a layer. A physical property that is related to an air pressure in a reactor chamber of a deposition apparatus for deposition at an atmospheric pressure is measured (902). A main gas mixture that includes a source gas and an auxiliary gas is introduced into the reactor chamber, wherein the source gas includes a precursor material and a carrier gas (904). A gas flow of at least one of the source gas and the auxiliary gas into the reactor chamber is controlled in response to a change of the air pressure in the reactor chamber (906).

The measured physical property may any physical quantity from which the air pressure and/or a change of the air pressure in the reactor chamber may be derived. For example, the atmospheric pressure in the reactor chamber may be measured directly. According to another embodiment a physical property that in combination with other known parameters may be measured and combined with the known parameters to obtain the atmospheric pressure in the reactor chamber. For example, the ambient pressure may be measured and combined with parameters that describe the atmospheric pressure in the reactor chamber as a function of the ambient pressure.

In the reactor chamber, one or more constituent(s) of the precursor material deposit on a front surface of a substrate and form a layer.

The substrate may be a semiconductor wafer, e.g., a silicon wafer, a germanium wafer, a wafer from a germanium-silicon crystal or an SOI (silicon-on-insulator) wafer with a single-crystal base layer formed on an insulating substrate such as glass. The semiconductor wafer or the single-crystalline base layer may be intrinsic or may include dopant atoms. The semiconductor wafer or the single-crystalline base layer may include non-doping atoms as process-induced impurities.

The layer may be an amorphous, nanocrystalline, microcrystalline or polycrystalline semiconductor layer. According to an embodiment, the layer may be single-crystal silicon layer grown by epitaxy on a suitable crystalline base, wherein atoms of the deposited constituent of the precursor material lock into the crystallographic orientation of the crystalline base and the deposited layer grows in registry with a crystal lattice of the crystalline base. For example, silicon atoms may be deposited on a silicon crystal, a germanium crystal, or a germanium/silicon crystal and may form a semiconductor layer from silicon. The semiconductor layer may be intrinsic or may include dopant atoms. The semiconductor layer may include non-doping impurities as a result of process imperfections, e.g. oxygen, carbon and/or hydrogen.

According to other embodiments the deposited layer may be a compound semiconductor layer, for example CdTe, a dielectric layer or a metal-containing layer.

The precursor material contains the constituent(s) of the deposited layer, for example, silicon. The carrier gas and the auxiliary gas may be free of constituents of the deposited semiconductor layer. The carrier gas and the auxiliary gas may have different compositions or the same composition.

The deposition apparatus may include a reactor chamber adapted for vapor phase deposition, e.g., vapor phase epitaxy, at atmospheric pressure. In particular, the deposition apparatus may be devoid of means for holding the air pressure in the chamber at a constant value. For example, the deposition apparatus is an APCVD (atmospheric pressure CVD) deposition apparatus. The air pressure in the reactor chamber may follow the atmospheric pressure immediately or with some delay, which deviates from the standard atmospheric pressure (101325 Pa) rarely by more than ±4%. The auxiliary gas and the source gas may be mixed prior to introduction into the reactor chamber, wherein the source gas and the auxiliary gas form a main gas mixture that may be introduced into the reactor chamber through at least one main inlet.

It could have been shown by the inventors that the deposition rate on mesas of a patterned substrate surface may change with atmospheric pressure. In the field of semiconductor manufacturing, a mesa is an area at a front side of a semiconductor substrate, where the semiconductor or a topmost layer has not been etched away. The mesa rises above a surrounding portion of the substrate surface and typically has a flat top surface.

In particular, deposition at higher atmospheric pressure may result in wider mesas than deposition at lower atmospheric pressure. By controlling a gas flow of at least one of the source gas and the auxiliary gas into the reactor chamber in response to a change of the air pressure in the reactor chamber, a more uniform deposition rate on mesas can be achieved for varying atmospheric pressure. For example, deposition of an epitaxial silicon layer on mesas with a width in a range between 100 nm and 100 µm may result in slower decrease of the width at higher atmospheric pressure than at lower atmospheric pressure.

According to an embodiment a flow rate of at least one of the source gas and the auxiliary gas is increased with increasing air pressure in the reactor chamber such that at least a portion of a reduction of the flow speed of the gas mixture is compensated that results from the increasing air pressure in the reactor chamber.

In accordance with a further embodiment the gas flow of at least one of the source gas and the auxiliary gas is controlled such that at varying atmospheric pressure in the reactor chamber a constant or approximately constant flow speed of the main gas mixture into the reactor chamber is achieved. By reducing fluctuations of the flow speed, a more reproducible deposition on mesa surfaces with a width in a range from 100 nm to 100 µm may be achieved. In particular, caps are deposited on mesas with higher reproducibility as regards the width of the caps. A more constant flow speed of the total gas flow may reduce mesa width deviations among a plurality of substrates after deposition. In other words, after deposition the width of mesas of a plurality of substrates shows smaller deviations.

The change of the air pressure in the reactor chamber may be compensated by controlling exclusively a gas flow of the auxiliary gas. In this case, the gas flow of the source gas into the reactor chamber remains unaffected such that the amount of precursor material introduced in the reactor chamber per time unit is held constant provided that the concentration of the precursor material in the source gas does not change.

In accordance with another embodiment both the gas flow of the source gas and the auxiliary gas into the reactor chamber are controlled in a way that a change of the flow rate of the main gas mixture is split up between a change of the source gas flow and a change of the auxiliary gas flow.

In the source gas, the mass ratio between precursor material and carrier gas may change with time. A gas flow of the source gas into the reactor chamber may be controlled in response to a change of a concentration of the precursor material in the source gas such that the amount of precursor material introduced into the reactor chamber per time unit is held constant when the concentration of the precursor material in the source gas changes. For example, if an initial concentration of the preliminary material in the source gas rises from 10% to 11%, the source gas flow of the source gas into the reactor chamber may be reduced by about 10% to keep constant the amount of precursor material introduced into the reactor chamber per time unit. A constant supply rate for the precursor material may result in a constant deposition rate over time.

In addition to and contemporaneously with the source gas an auxiliary gas is introduced into the reactor chamber, wherein an auxiliary gas flow of the auxiliary gas into the reactor chamber may be controlled such that a total gas flow made up of the source gas flow and the auxiliary gas flow into the reactor chamber is held constant when the source gas flow changes.

Compensating the reduction of a source gas flow by an increase of the auxiliary gas flow to keep the total gas flow into the reactor chamber constant may result in that the semiconductor layer grows at higher uniformity across the front surface of the semiconductor wafer.

According to an embodiment at first the flow-rate of source gas may be controlled as a function of a concentration of the preliminary material in the source gas to achieve a desired deposition rate. Then the auxiliary gas flow is controlled to achieve high deposition uniformity across the wafer. Then the auxiliary gas flow may be adapted to the atmospheric pressure to achieve constant deposition rates on mesas. A possible detuning of the flow rate ratio between auxiliary gas and source gas may be in a range that does hardly affect the uniformity across the wafer.

According to an alternative embodiment the gas flow of the source gas and the auxiliary gas into the reactor chamber are controlled to ensure a constant flow speed and a constant ratio between the source gas flow and the auxiliary gas flow. Information about the concentration of the precursor material in the source gas may be used to calculate the actual deposition rate and to control the deposition time as a function of the actual deposition rate and a target thickness of the deposited layer.

The source gas may be combined with the auxiliary gas to form, in addition to a main gas mixture, a cross-flow gas mixture. The cross-flow gas mixture may be introduced into the reactor chamber through at least one cross-flow inlet. A flow direction of the cross-flow gas mixture at an opening of the cross-flow inlet into the reactor chamber may be tilted to a flow direction of the main gas mixture at an opening of the main inlet into the reactor chamber. For example, an angle between the flow direction of the cross-flow gas mixture at the opening of the cross-flow inlet and the flow direction of the main gas mixture at the opening of the main inlet may be in a range from 45° to 135°, for example in a range from 85° to 95°. The main inlets and the cross-flow inlets may be arranged to be oriented to a horizontal center point of the front surface of the semiconductor wafer.

According to an embodiment the ratio of a gas flow of the main gas mixture to a gas flow of the cross-flow gas mixture may be kept constant, when the source gas flow and/or the auxiliary gas flow changes in response to a change of the air pressure in the reactor chamber.

Typically, a mass ratio between the main flow through the main inlets and the cross-flow through the cross-flow inlets is unequal 1, for example, greater than 1. When the auxiliary gas flow is reduced in both the main flow and the cross-flow at an equivalent amount, the mass ratio between main flow and cross-flow may change. The change of the mass ratio between the main flow and the cross-flow may adversely affect the uniformity of the deposited semiconductor layer.

According to an embodiment, the portion of the auxiliary gas in the cross-flow gas mixture may be controlled such that the mass ratio of the main flow to the cross-flow is held constant such that semiconductor layers, e.g. epitaxial silicon layers can be deposited with high thickness uniformity across the complete wafer surface.

According to an embodiment the precursor material may contain a semiconductor element, for example, silicon and/ or germanium. The precursor material may be gaseous at 25° C. and 1 atm or may contain a gaseous compound. For example, the precursor material may contain dicholorosilane $H_2SiCl_2$. Alternatively, the precursor material may be liquid at a temperature of 30° C. According to an embodiment, the precursor material may contain TCS (trichlorosilane, $HSiCl_3$) and/or tetrachlorosilane $SiCl_4$.

According to an embodiment, the carrier gas and the auxiliary gas may contain hydrogen gas. For example, the carrier gas and the auxiliary gas may contain hydrogen gas as sole main constituent and include other components only as unwanted impurities. According to other embodiments, at least one of the carrier gas and the auxiliary gas may contain at least one noble gas, such as helium, argon and neon, wherein the auxiliary gas and the carrier gas may include the same main constituents at the same ratio or at different ratios.

According to at least one embodiment, the information about the pressure in the reactor chamber may be obtained from a pressure sensor outside the reactor chamber, for example, in the outlet of the deposition apparatus or from a pressure sensor remote from the deposition apparatus such that the method can be simply applied to various types of deposition apparatuses without mechanical modification.

According to other embodiments the atmospheric pressure is measured in the reactor chamber of the deposition apparatus, for example, by a pressure sensor mounted in the reactor chamber such that unbiased information about the air pressure in the reactor chamber is available without time delay.

Figure 2A:
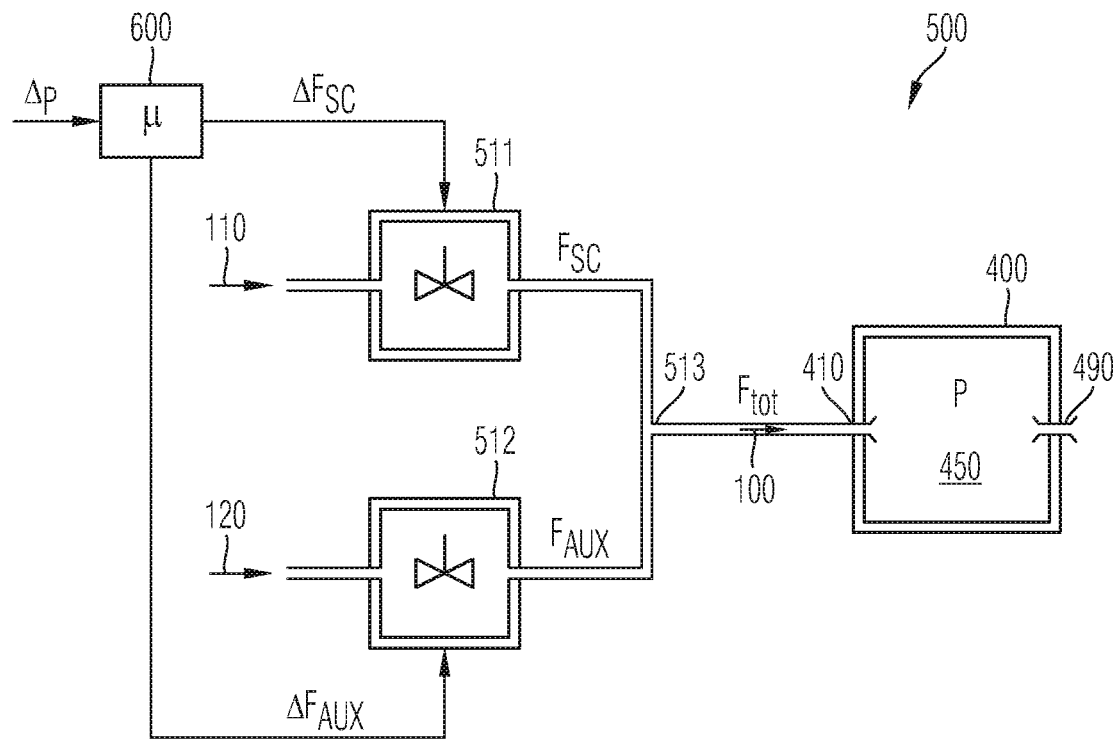
FIG. 2A is a schematic block diagram of an apparatus including a processor unit controlling a first main flow controller unit and a second main flow controller unit in response to a change of an air pressure in a reactor chamber of a deposition apparatus according to an embodiment.

FIG. 2A shows an apparatus 500 for forming layers, e.g., semiconductor layers. The apparatus 500 may be an APCVD system. The apparatus 500 includes a deposition apparatus 400 that is adapted for the deposition of a semiconductor layer by vapor phase deposition, for example, by vapor phase epitaxy at atmospheric pressure. A first main flow controller unit 511 controls a gas flow of a source gas 110 into the reactor chamber 450 of the deposition apparatus 400, wherein the source gas 110 contains a precursor material and a carrier gas. A second main flow controller unit 512 controls a gas flow of an auxiliary gas 120 into the reactor chamber 450.

The first and second main flow controller units 511, 512 may include MFCs (mass flow controllers) that control the rate of flow of a gaseous compound or gaseous mixture that passes the MFC according to a selected setpoint. For example, the MFC may include a mass flow sensor, a control valve and an internal control unit that may compare a value of the gas flow obtained from the mass flow sensor to adjust the control valve in an appropriate way to achieve a flow rate according to the selected setpoint.

A main mixture unit 513 may combine the source gas 110 and the auxiliary gas 120 after the passage through the first and second main flow controller units 511, 512 and prior to entering the reactor chamber 450. The main mixture unit 513 delivers a main gas mixture 100 that contains the source gas 110 and the auxiliary gas 120 and that enters the reactor chamber 450 through at least one main inlet 410.

A processor unit 600 may control at least one of the first and second main flow controller units 511, 512 in response to information about a change of an air pressure p in the reactor chamber 450. For example, the processor unit 600 may control at least one of the first main flow controller unit 511 and the second main flow controller unit 512 to reduce the total gas flow $F_{tot}$ when the air pressure p in the reactor chamber 450 decreases and the processor unit 600 may control at least one of the first main flow controller unit 511 and the second main flow controller unit 512 to increase the total gas flow $F_{tot}$ when the air pressure p in the reactor chamber 450 rises.

For example, the processor unit 600 may control the second main flow controller unit 512 in response to information about the air pressure p in the reactor chamber 450 to compensate for a change of the flow speed of the main gas mixture 100 resulting from a change of the air pressure p in the reactor chamber 450 and to keep the flow speed of the main gas mixture 100 constant. The processor unit 600 may control the second main flow controller unit 512 to let more of the auxiliary gas 120 pass when the air pressure p rises. As a result, the deposition rate on mesas formed on a front surface of a semiconductor wafer placed in the reactor chamber 450 may show higher stability and reproducibility.

Figure 2B:
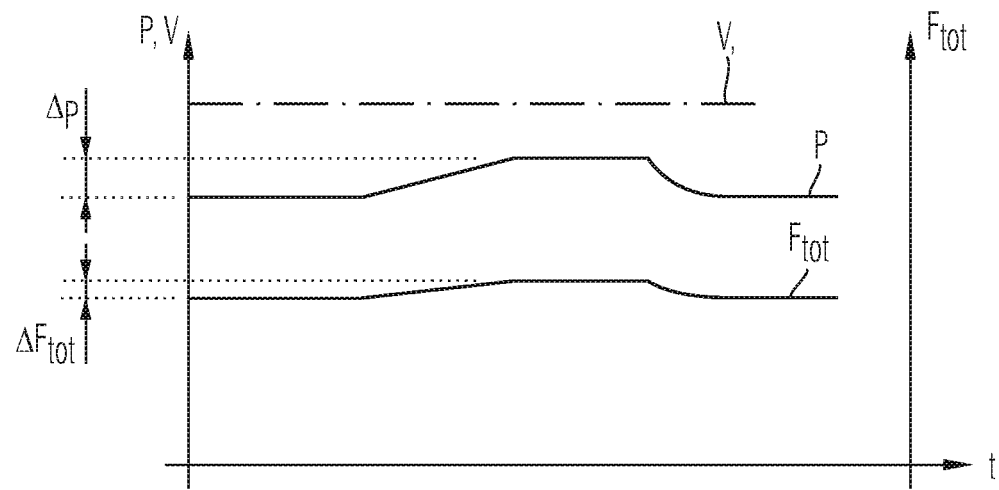
FIG. 2B is a schematic diagram illustrating the control of gas flows with time for discussing effects of the embodiments.

FIG. 2B shows an example of the control of the processor unit 600 exerted on at least one of the first and second main flow controller units 511, 512. As long as the air pressure p in the reactor chamber 450 is constant, the total flow rate $F_{tot}$ is constant. A linear increase of the air pressure p may result in an increase, e.g., in a linear increase of the total gas flow rate $F_{tot}$ and an exponential drop of the air pressure p may be compensated by a drop, e.g., by an exponential drop of the total gas flow rate $F_{tot}$.

Since the air pressure p in the reactor chamber 450 substantially follows the ambient pressure and the change rate of the ambient pressure is slow, it may be sufficient to measure the air pressure p in the reactor chamber 450 and to adapt the total mass flow rate $F_{tot}$ only once at the beginning of a deposition process of a semiconductor wafer. Once the total mass flow rate $F_{tot}$ has been selected for a certain deposition process, the partial mass flow rates $F_{SC}$ and $F_{aux}$ may be subjected to further process control.

For example, in the source gas 110 a concentration of the precursor material may rise to a certain degree after a certain process time. In response to information indicating the rise of the processor unit 600 may control the first main flow controller unit 511 to reduce the source gas flow $F_{SC}$ into the reactor chamber 450 such that the rate at which precursor material is introduced into the reactor chamber 450 remains constant. In addition, in response to information indicating the change $\Delta F_{SC}$ of the flow of the source gas 110, the processor unit 600 may control the second main flow controller unit 512 to increase the auxiliary gas flow $F_{aux}$ such that a total gas flow $F_{tot}$ of the source gas 110 and the auxiliary gas 120 into the reactor chamber 450 remains constant. The constant total gas flow $F_{tot}$ in combination with the constant rate at which the precursor material is introduced into the reactor chamber 450 provides highly time-independent and uniform deposition rate across a wafer surface. For many applications the uniformity of the deposition and uniform growth on mesas may outweigh some thickness variation as a result of a slight change of the deposition rate with time.

Figure 3:
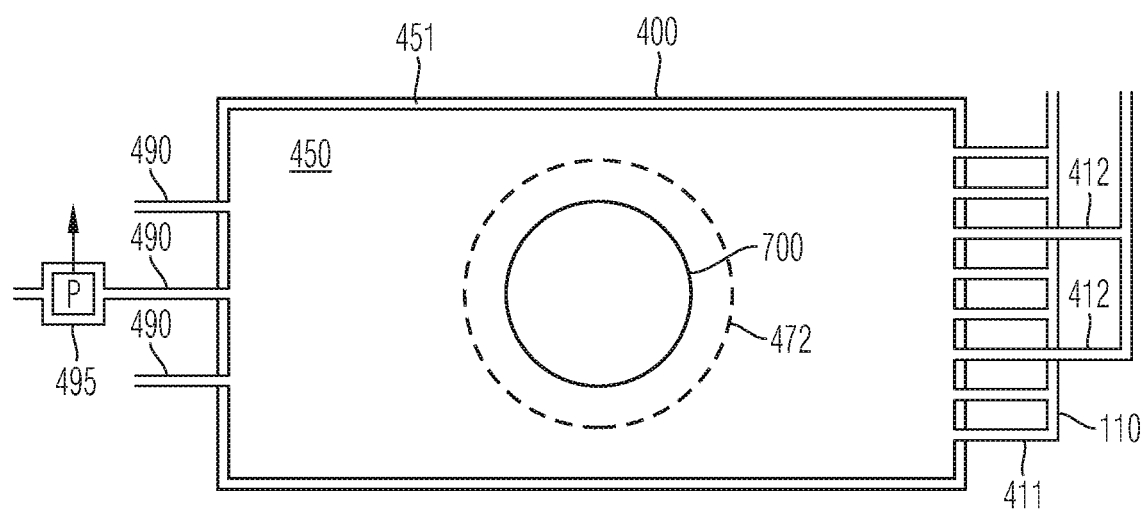
FIG. 3 is a schematic diagram of a deposition apparatus for vapor phase deposition at atmospheric pressure according to an embodiment with an air pressure sensor positioned in an outlet tube.

FIG. 3 shows a deposition apparatus 400 suitable for APCVD, e.g., chemical vapor epitaxy. A wafer holder 472 (susceptor, wafer support) in a reactor chamber 450 of the deposition apparatus 400 is adapted for carrying a semiconductor wafer 700 with a thickness of less than 1 mm and with a diameter of 100 mm, 150 mm, 200 mm, 300 mm, or 450 mm by way of example. In a horizontal plane defined by the supporting surface of the wafer holder 472, the reactor chamber 450 may have an approximately rectangular cross-section. The deposition apparatus 400 may include heating members that may heat at least one of the wafer holder 472, a chamber wall 451 and a semiconductor wafer 700 placed on the wafer holder 472. The deposition apparatus 400 may also include a motor drive unit for rotating the susceptor around a vertical axis through the horizontal center point during deposition. According to an embodiment the deposition apparatus 400 may include a radiation source for applying heat, e.g., a temperature of at least 800° C. or at least 900° C. to an exposed front surface of the semiconductor wafer 700.

The deposition apparatus 400 may include several first main inlets 411 through which a source gas 110 or a mixture of the source gas 110 and an auxiliary gas 120 is introduced into the reactor chamber 450 and may include second main inlets 412 for introducing the auxiliary gas 120 without source gas into the reactor chamber 450. The first and the second main inlets 411, 412 may be arranged at one side of the reactor chamber 450. The chamber wall 451 may include at least one outlet 490, which may be arranged at a side opposite to the first and second main inlets 411, 412.

In an outlet tube 495, in the reactor chamber 450 or outside the reactor chamber 450, an air pressure sensor 460 may be positioned that measures the air pressure in the reactor chamber 450 or in the outlet tube 495. The air pressure sensor 460 may be data-linked with the processor unit 600 of FIG. 2A.

With the deposition apparatus 400 of FIG. 3 used in the apparatus 500 as illustrated in FIG. 2A, the processor unit 600 may control at least one of the first and second main flow controller units 511, 512 such that a flow speed of a main gas mixture 100 containing the auxiliary gas 120 and the source gas 110 introduced through the first and second main inlets 411, 412 is held constant when the air pressure p changes.

Figure 4A:
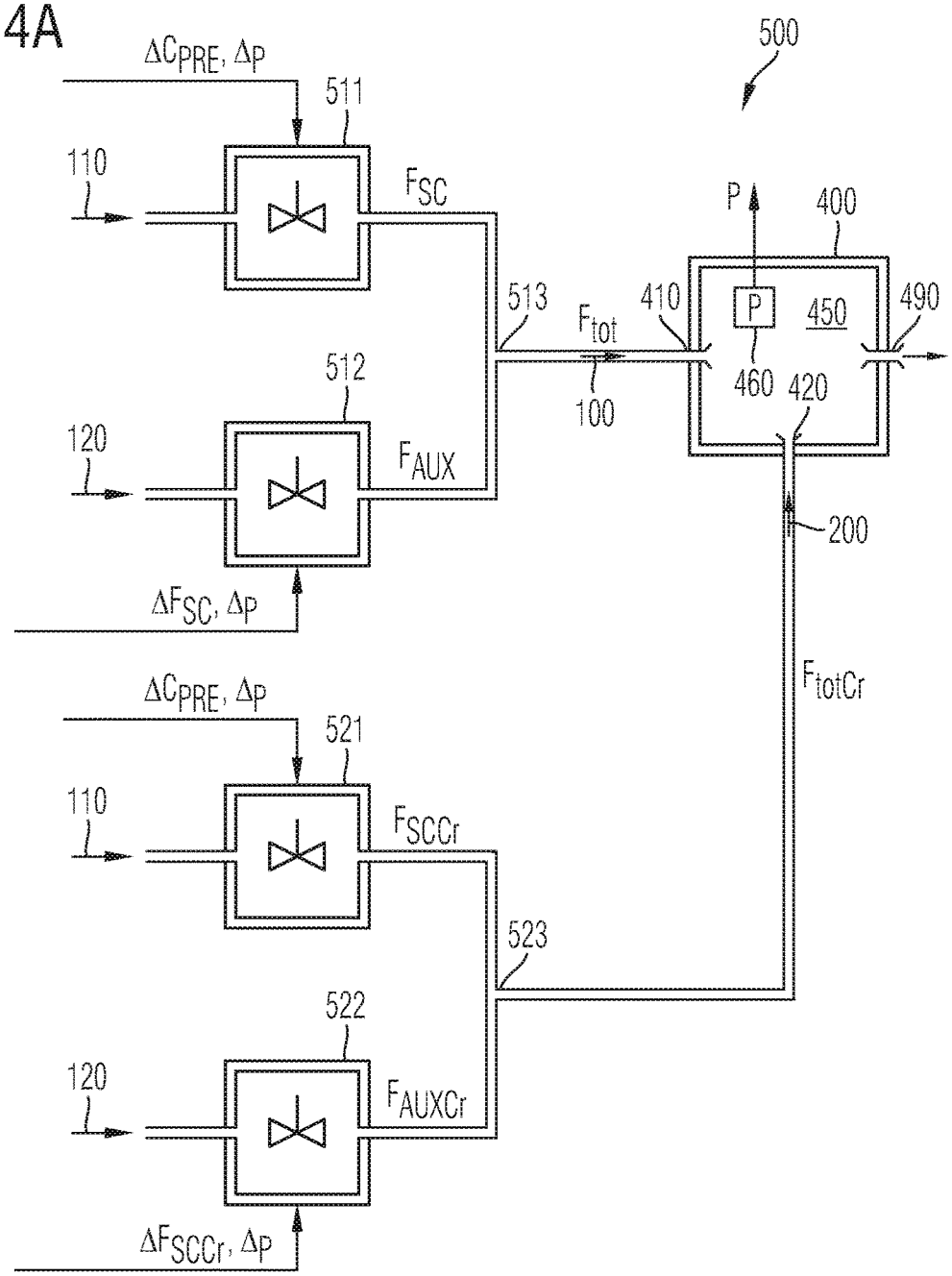
FIG. 4A is a schematic block diagram of an apparatus for layer deposition at atmospheric pressure according to an embodiment concerning the control of main flow and cross-flow.
Figure 4B:
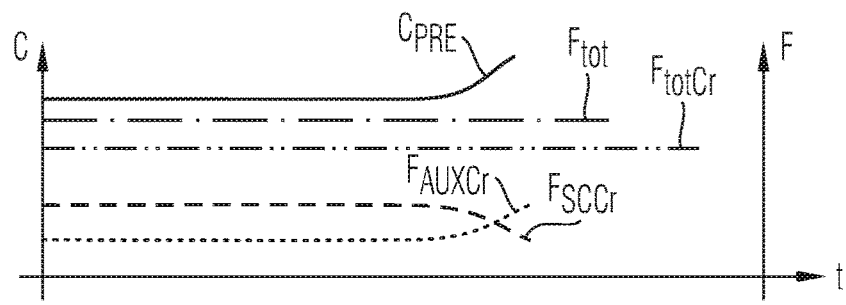
FIG. 4B is a schematic diagram illustrating the control of gas flows for discussing effects of the embodiments.

FIGS. 4A and 4B refer to an apparatus 500 that includes a deposition apparatus 400 with at least one cross-flow inlet 420 for letting pass a cross-flow gas mixture 200, wherein a flow direction of the cross-flow gas mixture 200 at an opening of the cross-flow inlet 420 into the reactor chamber 450 is tilted to a flow direction of the main gas mixture 100 at an opening of the main inlet into the reactor chamber 450. A tilt angle between the two flow directions may be in a range from, e.g., 45° to 135°, e.g., 85° to 95°. An air pressure sensor 460 may be positioned in a reactor chamber 450 of the deposition apparatus 400.

In addition to a first and a second main flow controller unit 511, 512 as described with reference to FIGS. 2A and 2B, the apparatus 500 includes a first cross-flow controller unit 521 that controls a gas flow $F_{SCCr}$ of the source gas through the at least one cross-flow inlet 420. A second cross-flow controller unit 522 controls a gas flow $F_{AuxCr}$ of the auxiliary gas 120 through the at least one cross-flow inlet 420. The first and second cross-flow controller units 521, 522 may be or may include MFCs.

The second cross-flow controller unit 522 may be controlled in response to data that may include information about the change $\Delta F_{SCCr}$ of the gas flow $F_{SCCr}$ of the source gas 110 through the first cross-flow controller unit 521. For example, the second cross-flow controller unit 522 is controlled such that a total gas flow $F_{totCr}$ of the auxiliary gas 120 and the source gas 110 through the cross-flow inlet 420 remains constant.

Figure 5:
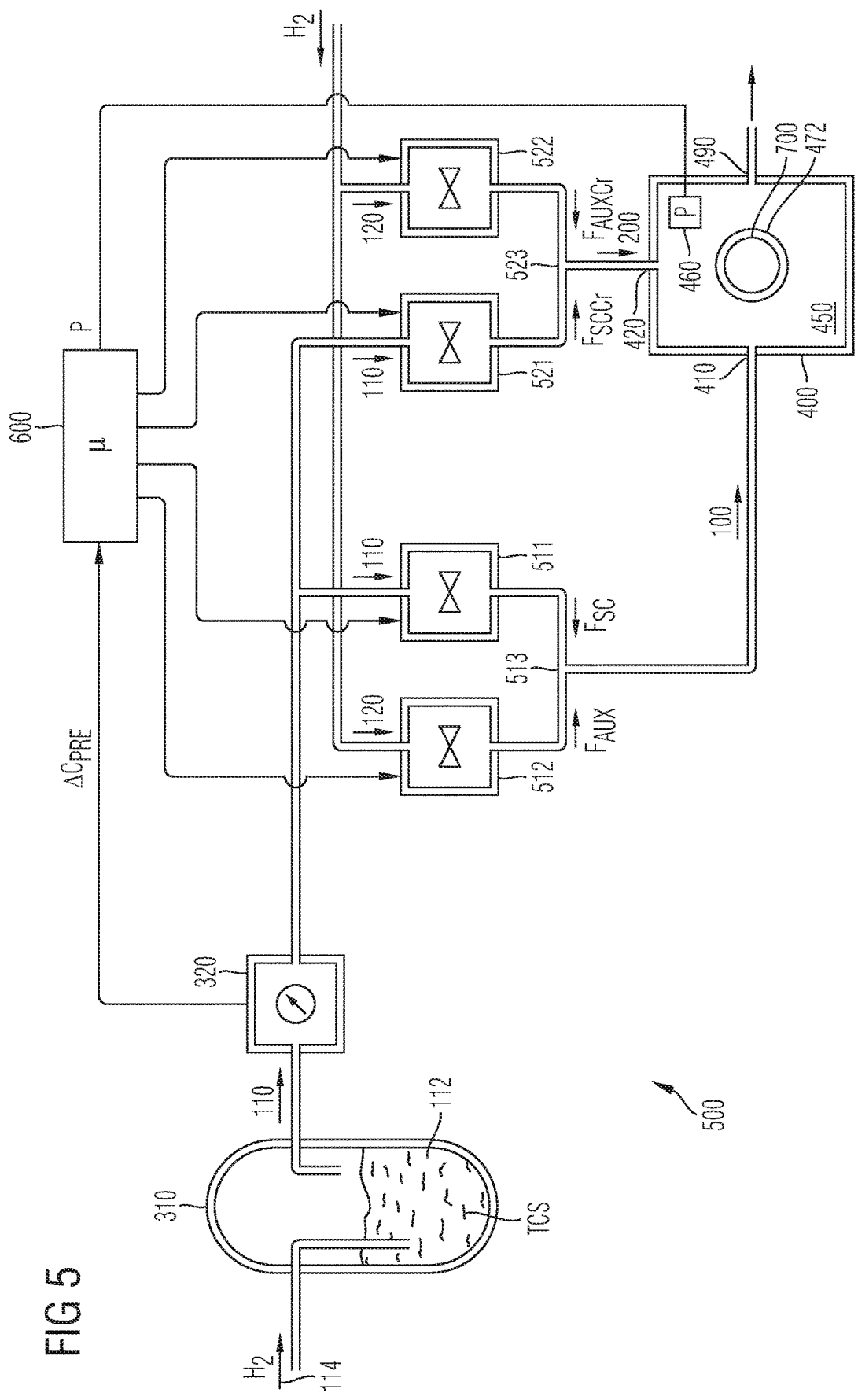
FIG. 5 is a schematic diagram of an apparatus for layer deposition at atmospheric pressure according to a further embodiment concerning liquid precursor materials.

FIG. 5 shows a further apparatus 500 for forming a semiconductor layer. A bubbler 310 contains a precursor material 112 that is liquid at a temperature of 30° C. The precursor material 112 may be tetrachlorosilane or trichlorosilane or a mixture of both. A carrier gas 114 passes through the liquid precursor material 112 and vaporizes some of the liquid precursor material 112. A mixture of the carrier gas 114 and vaporized components of the precursor material 112 leaves the bubbler 310 through an outlet and forms the source gas 110. The carrier gas 114 may contain hydrogen gas and/or one or more noble gases such as helium, argon and neon. According to an embodiment, the carrier gas 114 contains hydrogen gas as the only main constituent and contains other atoms, molecules and/or compounds only as impurities.

A concentration measurement unit 320 may measure a content of the precursor material 112 in the source gas 110. The concentration measurement unit 320 may be data-linked with a processor unit 600 and may transmit information about a change $\Delta C_{pre}$ of a concentration $C_{pre}$ of the precursor material 112 in the source gas 110 to the processor unit 600.

A first main flow controller unit 511 controls a gas flow $F_{SC}$ of the source gas 110 through one or more main inlets 410 of a deposition apparatus 400. A first cross-flow controller unit 521 controls a gas flow $F_{SCCr}$ of the source gas 110 through one or more cross-flow inlets 420 of the deposition apparatus 400.

A second main flow controller unit 512 controls a gas flow $F_{Aux}$ of an auxiliary gas 120 through the one or more main inlets 410. A second cross-flow controller unit 522 controls the gas flow $F_{AuxCr}$ of the auxiliary gas 120 through the one or more cross-flow inlets 420.

A main mixture unit 513 may combine the source gas 110 passing the first main flow controller unit 511 and the auxiliary gas 120 passing the second main flow controller unit 512 prior to introduction into a reactor chamber 450 of the deposition apparatus 400. A cross-flow mixture unit 523 may combine the source gas 110 passing the first cross-flow controller unit 521 and the auxiliary gas 120 passing the second cross-flow controller unit 522 prior to introduction into the reactor chamber 450. An air pressure sensor 460 may be data-linked with the processor unit 600.

The processor unit 600 may control at least one of the first main flow controller unit 511 and the second main flow controller unit 512 in response to a change $\Delta p$ of the air pressure p in the reactor chamber 450. In addition, the pressure unit 600 may control the first main flow controller unit 511 in response to a change $\Delta C_{Pre}$ of the concentration $C_{pre}$ of the precursor material 112 in the source gas 110 in a way that the rate at which the precursor material 112 is delivered to the deposition apparatus 400 through the one or more main inlets 410 is constant even when the concentration $C_{pre}$ changes.

To this purpose, the processor unit 600 may administer setting values of the flow controller units 511, 512, 521, 522. According to an embodiment, the processor unit 600 may request and/or receive the setpoints of the first main flow controller unit 511 and the first cross-flow controller unit 521 for determining the control values for the second main flow controller unit 512 and the second cross-flow controller unit 522.

The processor unit 600 may control at least one of the first cross-flow controller unit 521 in response to the change $\Delta p$ of the air pressure p. In addition the processor unit 600 may control the first cross-flow controller unit 521 and the second cross flow controller unit 522 in response to the change $\Delta C_{Pre}$ of the concentration $C_{pre}$ of the precursor material 112 in the source gas 110 in a way that the rate at which the precursor material 112 is delivered to the reactor chamber 450 through the one or more cross-flow inlets 420 is constant even when the concentration $C_{pre}$ changes.

The processor unit 600 may control at least one of the first and second main flow controller units 511, 512 such that a flow speed of a main gas mixture 100 containing the auxiliary gas 120 and the source gas 110 introduced through the first and second main inlets 411, 412 is held constant when the air pressure p changes.

In addition, when the concentration $C_{pre}$ of the precursor material 112 in the source gas 110 rises, the processor unit 600 may control the first main flow controller unit 511 and the first cross-flow controller unit 521 to reduce the source gas flow into the reactor chamber 450 in a way that the amount of the precursor material introduced per time unit into the reactor chamber 450 remains constant.

The processor unit 600 may further control the second main flow controller unit 512 to increase the auxiliary gas flow $F_{Aux}$ such that the total main gas flow $F_{tot}$ through the one or more main inlets 410 remains constant when the first main flow controller unit 511 reduces the source gas flow $F_{SC}$.

In addition, the processor unit 600 may control the second cross-flow controller unit 522 to increase the auxiliary gas flow $F_{AuxCr}$ such that a total cross-flow $F_{totCr}$ through the at least one cross-flow inlet 420 remains constant when the source gas flow $F_{SCCr}$ through the cross-flow inlets changes.

The apparatus 500 may facilitate a constant flow speed of the main gas flow and the cross gas flow at changing atmospheric pressure. The apparatus 500 may further facilitate a constant total gas flow into the reactor chamber 450 even when the source gas flow is reduced to compensate for a concentration change of the precursor material 112 in the source gas. The apparatus 500 may further facilitate a constant ratio of the main flow to the cross-flow when the concentration of the precursor material 112 in the source gas 110 changes.

The apparatus 500 allows the deposition of epitaxial silicon at a rate of 0-20 μm/min on semiconductor wafers as described above.

Figure 6A:
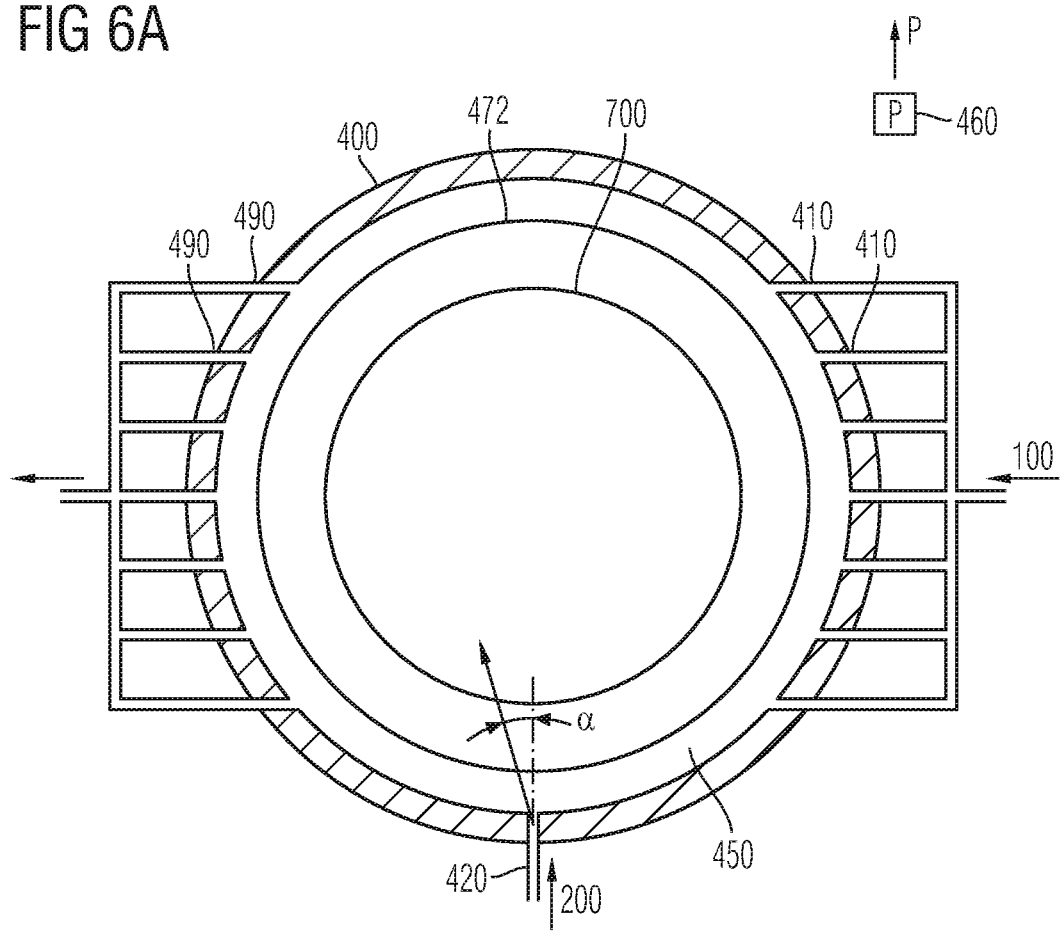
FIG. 6A is a schematic horizontal cross-sectional view of a vapor phase deposition apparatus with cross-flow inlet and air pressure sensor according to a further embodiment.
Figure 6B:
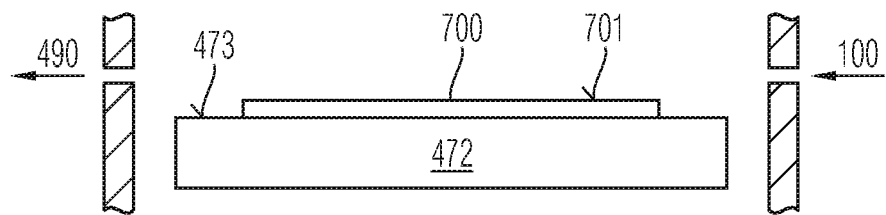
FIG. 6B is a schematic vertical cross-sectional view of the deposition apparatus of FIG. 6A.

FIGS. 6A and 6B show a deposition apparatus 400 including a reactor chamber 450 with almost circular horizontal cross-section in the plane of a supporting surface 473 of a wafer holder 472. A semiconductor wafer 700 may be placed on the supporting surface 473 of a wafer holder 472 that may be centered to a horizontal center of the reactor chamber 450. The deposition apparatus 400 deposits a layer on an exposed front surface 701 of the semiconductor wafer 700.

At a first side, the deposition apparatus 400 may include one or a plurality of main inlets 410 which may be arranged such that the partial gas flows through the main inlets 410 are parallel to each other. At a second side opposite to the first side, the deposition apparatus 400 may include one or more outlets 490. One or more cross-flow inlets 420 are arranged such that gas streams passing the cross-flow inlets 420 have a flow direction tilted to a flow direction of the gas streams through the main inlets 410.

In an outlet 490, in the reactor chamber 450 or outside the reactor chamber 450, an air pressure sensor 460 may be positioned that measures the air pressure in the reactor chamber 450, in the outlet 490 or the ambient pressure. The air pressure sensor 460 may be data-linked with a processor unit as shown in FIG. 2A.

The main flow may be significantly stronger than the cross-flow. The main flow may deflect the cross-flow in the reactor chamber 450 at a certain deflection angle α. Keeping the ratio of the total main flow to the total cross-flow constant results in that the deflection angle α does not change and the deposition rate is more uniform across the wafer surface.

FIG. 7 refers to another embodiment of a deposition apparatus 400 with the cross-flow inlets 420 arranged in groups and symmetrically with respect to a symmetry axis of the main inlets 410. The deposition apparatus 400 may include an air pressure sensor 460 as described with reference to one of the previous figures.

A processor unit as described with reference to FIGS. 2A and 5 may represent an apparatus that controls a deposition apparatus for depositing semiconductor layers at atmospheric pressure. The processor unit may be integrated part of the deposition apparatus or a stored-program control assigned to and data-linked with the deposition apparatus. The processor unit may be a computer, server or part of a network of servers and computers executing a software code.

The apparatus executes a method of controlling an epitaxy apparatus for depositing layers at atmospheric pressure. The apparatus includes means for receiving information about an air pressure in a reactor chamber of a deposition apparatus; means for calculating an updated gas flow of a main gas flow to keep a flow speed of the main gas into the reactor constant when the air pressure in the reactor chamber changes, wherein the main gas flow includes a source gas and an auxiliary gas and the source gas includes a carrier gas and a precursor material; means for outputting at least one of first control data about an updated source gas flow and second control data about an updated gas flow of the auxiliary gas.

The apparatus executes a method of controlling an epitaxy apparatus for depositing layers at atmospheric pressure. The method includes receiving information about an air pressure in a reactor chamber of a deposition apparatus; calculating an updated gas flow of a main gas flow to keep a flow speed of the main gas into the reactor chamber constant when the air pressure in the reactor chamber changes, wherein the main gas flow includes a source gas and an auxiliary gas and the source gas includes a carrier gas and a precursor material; outputting at least one of first control data about an updated source gas flow and second control data about an updated gas flow of the auxiliary gas.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method of depositing a layer, the method comprising:
measuring a physical property that is related to an air pressure in a reactor chamber of a deposition apparatus;
introducing, at an atmospheric pressure, a main gas mixture comprising a source gas and an auxiliary gas into the reactor chamber, the source gas comprising a precursor material and a carrier gas; and
controlling a gas flow of at least one of the source gas and the auxiliary gas into the reactor chamber in response to a change of the air pressure in the reactor chamber,
wherein the gas flow of at least one of the source gas and the auxiliary gas is controlled to obtain, at varying atmospheric pressure in the reactor chamber, a constant flow speed of the main gas mixture into the reactor chamber.

2. The method of claim 1, wherein the gas flow of at least one of the source gas and the auxiliary gas is increased with increasing air pressure in the reactor chamber.

3. The method of claim 1, wherein a gas flow of the source gas is controlled in response to a change of a concentration of the precursor material in the source gas, and wherein a gas flow of the auxiliary gas is controlled such that a total gas flow of the source gas and the auxiliary gas into the reactor chamber is held constant when the gas flow of the source gas changes.

4. The method of claim 3, wherein the source gas is combined with the auxiliary gas to form a cross-flow gas mixture, wherein the cross-flow gas mixture is introduced into the reactor chamber through at least one cross-flow inlet, and wherein a ratio of a gas flow of the main gas mixture to a gas flow of the cross-flow gas mixture is held constant when the gas flow of at least one of the source gas and the auxiliary gas changes in response to a change of the air pressure in the reactor chamber.

5. The method of claim 4, wherein a flow direction of the cross-flow gas mixture at an opening of the cross-flow inlet into the reactor chamber is tilted to a flow direction of the main gas mixture at an opening of the main inlet into the reactor chamber.

6. The method of claim 1, wherein the precursor material contains a semiconductor element.

7. The method of claim 1, wherein the precursor material contains at least one of trichlorosilane, tetrachlorosilane, and dichlorosilane.

8. The method of claim 1, wherein at least one of the carrier gas and the auxiliary gas contains hydrogen gas.

9. The method of claim 1, wherein the atmospheric pressure in the reactor chamber is measured in the reactor chamber.

* * * * *